United States Patent
Kim et al.

(10) Patent No.: US 10,985,417 B2
(45) Date of Patent: Apr. 20, 2021

(54) BATTERY INCLUDING HEAT DISSIPATION PLATE AND ELECTRONIC DEVICE HAVING THE SAME

(71) Applicant: Samsung Electronics Co., Ltd., Suwon-si (KR)

(72) Inventors: Min Soo Kim, Gumi-si (KR); Man Ki Choi, Daegu (KR); Ji Woo Lee, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 176 days.

(21) Appl. No.: 15/914,525

(22) Filed: Mar. 7, 2018

(65) Prior Publication Data

US 2018/0261900 A1 Sep. 13, 2018

(30) Foreign Application Priority Data

Mar. 10, 2017 (KR) ........................ 10-2017-0030835

(51) Int. Cl.
| | |
|---|---|
| *H01M 10/00* | (2006.01) |
| *H01M 10/667* | (2014.01) |
| *H02H 7/18* | (2006.01) |
| *H05K 1/02* | (2006.01) |
| *H05K 1/18* | (2006.01) |
| *H01M 10/42* | (2006.01) |
| *H01M 10/6554* | (2014.01) |
| *H05K 1/14* | (2006.01) |

(Continued)

(52) U.S. Cl.
CPC ....... *H01M 10/667* (2015.04); *H01M 10/425* (2013.01); *H01M 10/6554* (2015.04); *H02H 7/18* (2013.01); *H05K 1/0203* (2013.01); *H05K 1/0209* (2013.01); *H05K 1/181* (2013.01); *H01M 2200/00* (2013.01); *H01R 12/7076* (2013.01); *H01R 12/77* (2013.01); *H05K 1/147* (2013.01); *H05K 2201/066* (2013.01); *H05K 2201/10037* (2013.01)

(58) Field of Classification Search
CPC . H01M 10/667; H05K 1/0203; H05K 1/0209; H05K 1/147; H05K 1/181; H05K 2201/066; H05K 2201/10037; H02H 7/18
USPC ........................................................ 361/704
See application file for complete search history.

(56) References Cited

U.S. PATENT DOCUMENTS

| 2003/0019607 A1* | 1/2003 | Wei ...................... F28D 15/0241 165/46 |
|---|---|---|
| 2008/0123296 A1* | 5/2008 | Chen ...................... H01L 23/427 361/700 |

(Continued)

FOREIGN PATENT DOCUMENTS

| JP | 2015-088380 A | 5/2015 |
|---|---|---|
| KR | 10-2015-0018412 A | 2/2015 |

(Continued)

*Primary Examiner* — Anatoly Vortman
*Assistant Examiner* — Zhengfu J Feng
(74) *Attorney, Agent, or Firm* — Jefferson IP Law, LLP

(57) ABSTRACT

A battery is provided. The battery includes a battery pouch including at least one conductive terminal exposed to the outside, a printed circuit board electrically connected with the at least one conductive terminal and including a signal area and a non-signal area, a protection circuit electrically connected with the battery pouch, disposed on the signal area, and a heat dissipation plate connected with the non-signal area.

15 Claims, 13 Drawing Sheets

(51) Int. Cl.
H01R 12/70 (2011.01)
H01R 12/77 (2011.01)

(56) References Cited

U.S. PATENT DOCUMENTS

| | | | |
|---|---|---|---|
| 2015/0044511 A1 | 2/2015 | Kim et al. | |
| 2015/0162650 A1* | 6/2015 | Ahn | H01M 2/1061 |
| | | | 429/90 |
| 2015/0201533 A1* | 7/2015 | Daughtry, Jr. | H05K 9/0028 |
| | | | 174/377 |
| 2016/0164146 A1* | 6/2016 | Na | H01M 2/0473 |
| | | | 429/7 |
| 2016/0233479 A1 | 8/2016 | Ann et al. | |
| 2016/0233554 A1 | 8/2016 | Choi et al. | |

FOREIGN PATENT DOCUMENTS

KR  10-2015-0035001 A  4/2015
KR  10-2015-0035182 A  4/2015

* cited by examiner

BATTERY INCLUDING HEAT DISSIPATION PLATE AND ELECTRONIC DEVICE HAVING THE SAME

CROSS-REFERENCE TO RELATED APPLICATION(S)

This application is based on and claims priority under 35 U.S.C. § 119(a) of a Korean patent application number 10-2017-0030835, filed on Mar. 10, 2017, in the Korean Intellectual Property Office, the disclosure of which is incorporated by reference herein in its entirety.

TECHNICAL FIELD

The disclosure relates to a battery including a heat dissipation plate and an electronic device having the same. More particularly, the present disclosure relates to a battery having a heat dissipation structure for releasing heat generated in a protection circuit module (PCM) of a battery to the outside, and an electronic device having the same.

BACKGROUND

An electronic device may have a battery pouch of an in-cell type for waterproofing. The battery pouch may include a battery cell, a PCM, a pouch, and a connecting unit.

The battery cell may have electricity charged therein and may supply the electricity to an electronic device through a positive electrode tap and a negative electrode tap as electric power.

The above information is presented as background information only to assist with an understanding of the disclosure. No determination has been made, and no assertion is made, as to whether any of the above might be applicable as prior art with regard to the disclosure.

SUMMARY

In the process of supplying electric power to the electronic device through the battery cell, a current path flowing through a power switch may be formed, and impedance characteristics including series resistance of the power switch may cause an IR drop and heat in proportion to the battery supply current. Heat generated in the protection circuit module (PCM) may increase the impedance value of the power switch again to increase current consumption loss, thereby reducing battery life.

Meanwhile, a mechanically robust structure may be required to protect the PCM and the battery cell from external shocks to the battery. For example, a protective case may be disposed to surround the PCM and the battery cell.

Due to the protective case, heat generated in the PCM may not be released to the outside and may exist in a pocket form (e.g., a hot air pocket). Furthermore, heat generated in a switch may diffuse through a printed circuit board (PCB), but a heat-island phenomenon may arise in which heat is accumulated in the uppermost copper (Cu) layer, on which the switch component is located, due to a difference in the heat diffusion rate between a prepreg (PPG)-based layer and the Cu layer that exist on the PCB layer. That is, heat generated in the PCM may be mainly concentrated on an upper end portion of the battery pouch to further increase a difference in temperature between the upper and lower end portions of the battery pouch. The temperature difference may cause a negative effect of aggravating an unstable charge state of the battery cell.

Aspects of the disclosure are to address at least the above-mentioned problems and/or disadvantages and to provide at least the advantages described below. Accordingly, an aspect of the disclosure is to provide a battery having a heat dissipation structure for releasing heat generated in a PCM of a battery to the outside, and an electronic device having the same.

In accordance with an aspect of the disclosure, a battery is provided. The battery includes a battery pouch including at least one conductive terminal exposed to the outside, a PCB electrically connected with the at least one conductive terminal and including a signal area and a non-signal area, a protection circuit electrically connected with the battery pouch, disposed on the signal area, and a heat dissipation plate connected with the non-signal area.

In accordance with another aspect of the disclosure, a battery is provided. The battery includes a pouch configured to surround a battery cell and including at least one conductive terminal connected with the battery cell and exposed to the outside, a PCB electrically connected with the at least one conductive terminal, with at least one component disposed on a signal area of the PCB, and a heat dissipation member connected with a non-signal area of the PCB.

In accordance with another aspect of the disclosure, an electronic device is provided. The electronic device includes a bracket, a main PCB mounted on the bracket, with a processor disposed on the main PCB, and a battery mounted on the bracket. The battery includes a battery cell, a battery pouch configured to surround the battery cell, at least one conductive terminal exposed outside the battery pouch, a PCB electrically connected with the at least one conductive terminal and including a signal area and a non-signal area, a protection circuit electrically connected with the battery pouch, disposed on the signal area, and a heat dissipation plate connected with the non-signal area.

According to embodiments of the disclosure, it is possible to suppress a temperature rise in a battery by using a PCM heat dissipation structure.

Furthermore, according to embodiments of the disclosure, by releasing heat generated in a PCM to the outside through the PCM heat dissipation structure, it is possible to suppress a temperature rise in the area of the battery in which the PCM is located, thereby resolving the temperature imbalance between the area of the battery in which the PCM is located and another area of the battery and thus alleviating the unstable state of the battery.

Moreover, according to embodiments of the disclosure, by suppressing a temperature rise in the battery, it is possible to suppress an increase in resistance of a power switch due to the temperature rise in the battery, thereby increasing battery life.

In addition, the disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
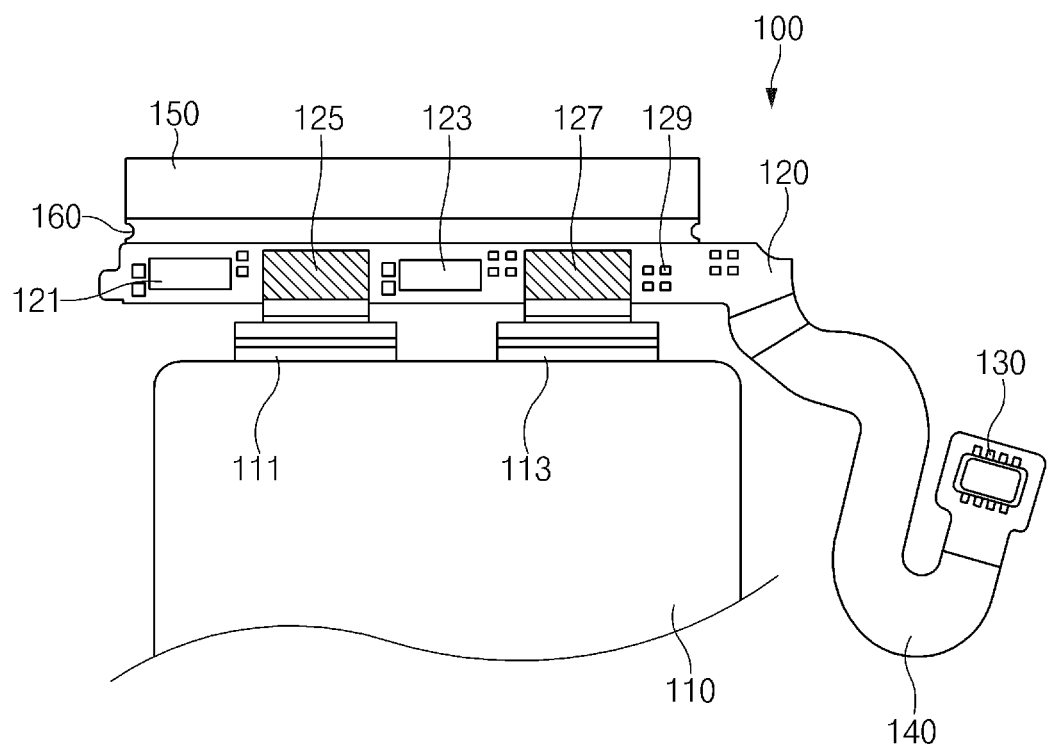
FIG. 1 illustrates a battery according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The term "include," "comprise," and "have", or "may include," or "may comprise" and "may have" used herein indicates disclosed functions, operations, or existence of elements but does not exclude other functions, operations or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st," "2nd," "first," "second," and the like used herein may refer to modifying various different elements of various embodiments of the disclosure, but are not intended to limit the elements. For instance, "a first user device" and "a second user device" may indicate different users regardless of order or importance. For example, a first component may be referred to as a second component and vice versa without departing from the scope and spirit of the disclosure.

In various embodiments of the disclosure, it is intended that when a component (e.g., a first component) is referred to as being "operatively or communicatively coupled with/to" or "connected to" another component (e.g., a second component), the component may be directly connected to the other component or connected through another component (e.g., a third component). In various embodiments of the disclosure, it is intended that when a component (e.g., a first component) is referred to as being "directly connected to" or "directly accessed" another component (e.g., a second component), another component (e.g., a third component) does not exist between the component (e.g., the first component) and the other component (e.g., the second component).

The expression "configured to" used in various embodiments of the disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (e.g., an embedded processor) for performing a corresponding operation or a general purpose processor (e.g., a central processing unit (CPU) or application processor (AP)) for performing corresponding operations by executing at least one software program stored in a memory device.

Terms used in various embodiments of the disclosure are used to describe certain embodiments of the disclosure, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the specification are not intended to be interpreted as excluding embodiments of the disclosure.

An electronic device according to various embodiments of the disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a moving picture experts group (MPEG-1 or MPEG-2) audio layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD), or the like), a textile- or clothing-integrated-type device (e.g., an electronic apparel), a body-attached-type device (e.g., a skin pad or a tattoo), or a bio-implantable-type device (e.g., an implantable circuit).

In some various embodiments of the disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ or Play Station™), an electronic dictionary, an electronic key, a camcorder, or an electronic picture frame.

In other various embodiments of the disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the disclosure may be a flexible device. An electronic device according to an embodiment of the disclosure is not limited to the above-mentioned devices, and may include new electronic devices with the development of new technology.

Hereinafter, an electronic device according to various embodiments of the disclosure will be described in more detail with reference to the accompanying drawings. The term "user" used herein may refer to a person who uses an electronic device or may refer to a device (e.g., an artificial intelligence electronic device) that uses an electronic device.

FIG. 1 illustrates a battery according to an embodiment of the disclosure.

Referring to FIG. 1, a battery 100 may include a pouch (or pack) 110 surrounding a battery cell, a first tap plate 125 and a second tap plate 127 connected with a first tap 111 (e.g., a positive electrode tap) and a second tap 113 (e.g., a negative electrode tap) formed on one surface of the pouch 110, respectively, a printed circuit board (PCB) 120 on which the first tap plate 125 and the second tap plate 127 are mounted and a protection circuit module (PCM) is formed, a connector 130 connected with a main PCB of an electronic device on which internal modules (e.g., a processor, a communication circuit, a memory, a power management integrated circuit (PMIC), or the like) are mounted, a connecting unit 140 for connecting the connector 130 and the PCB 120, and a heat dissipation member 150 (e.g., a heat sink plate) for dissipating heat generated in the PCB 120 to the outside.

The battery cell may include a lithium ion battery or a solid-state battery and may be surrounded and protected by the pouch 110. The battery cell may have a jelly roll form and may be implemented with an aluminum substrate, an electrolyte, and the like. In an embodiment of the disclosure, the battery cell, the pouch 110, the first tap 111, the second tap 113, and the PCM may be collectively referred to as a battery pack.

The PCB 120 may have the PCM and various types of components mounted thereon. The components may include, for example, power switches (e.g., a first switch 121 and a second switch 123), resistors 129, tap plates (e.g., the first tap plate 125 and the second tap plate 127), and the like. The PCB 120 may be implemented with a plurality of layers. For example, the PCB 120 may be implemented with two conductive copper (Cu) layers, a dielectric polyimide (PI) and/or prepreg (PPG)-based layer, and a cover layer (e.g., a film layer).

The power switches (e.g., the first switch 121 and the second switch 123) may prevent over-current (or over-voltage) from being supplied to the electronic device, and a plurality of power switches may be provided for dual design. The power switches may have internal series resistance (RON resistance) therein, and thus heat may be generated by current. The RON resistance, which is series impedance, may be maintained at a low level, but when temperature rises due to heat generation, the RON resistance may increase to a high level.

The tap plates 125 and 127 may connect taps (e.g., the first tap 111 and the second tap 113), which are connected with the battery cell, with the PCB 120. For example, the first tap plate 125 may connect the first tap 111 with the PCB 120, and the second tap plate 127 may connect the second tap 113 with the PCB 120. The tap plates 125 and 127 may have the shape of a bent plate and may make contact with the taps 111 and 113 in such a manner that the bent plates surround the taps 111 and 113. For example, the tap plates 125 and 127, which have a bent plate shape, may be laser welded to the taps 111 and 113 to surround upper and lower surfaces of the taps 111 and 113.

The connecting unit 140 that connects the connector 130 and the PCB 120 may be implemented with a flexible printed circuit board (FPCB). For example, the connecting unit 140 may be implemented with an FPCB extending from one surface of the PCB 120. The connector 130 may be electrically connected with the main PCB. According to an embodiment of the disclosure, the connector 130 may be connected with the main PCB through board-to-board connection, and in the case where the connector 130 is of a contact type, the connector 130 may include a contact pad that is connected with an elastic member of the main PCB.

The connector 130 may include four signal lines, which may be, for example, two power signal lines and two sensing signal lines. The power signal lines may include two lines connected with a positive (+) electrode line and a negative (−) electrode line, respectively, among power lines of the PMIC, and the sensing signal lines for sensing the status of the battery 100 may include two lines connected with a first electrode (e.g., a positive (+) electrode) and a second electrode (e.g., a negative (−) electrode) of a fuel gauge. However, the number of signal lines is not limited thereto, and at least one additional signal line may be further included. For example, in the case where the PCM has a fuel gauge therein, a circuit control signal line may be additionally provided.

The heat dissipation member 150 may be formed of a thermally conductive material to allow heat generated in the PCB 120 to be transferred to the heat dissipation member 150. For example, the heat dissipation member 150 may perform the same function as a heat sink plate. For example, the heat dissipation member 150 may be implemented with a separate PCB different from the PCB 120 or may extend from the PCB 120, and a part 160 connected with the PCB 120 may be formed of a flexible material. Furthermore, heat may be transferred to the heat dissipation member 150 through the conductive copper (Cu) layers of the PCB 120. In this regard, according to an embodiment of the disclosure, to diffuse heat generated in the PCB 120, the heat dissipation member 150 may be connected with the surface of the PCB 120 on which the components are mounted, and a conductive copper (Cu) layer may be exposed to the outside by removing a cover layer (e.g., a film layer) and a solder mask layer. Accordingly, the heat dissipation member 150 may make direct contact with a bracket or housing of the electronic device through the exposed surface, or may release heat through external air. In an embodiment of the disclosure, the heat dissipation member 150 may be implemented with a rigid PCB having no PPG layer, and thus the flexibility of the heat dissipation member 150 may be ensured. For example, the heat dissipation member 150 may be provided in a form similar to an FPCB. In another example, the heat dissipation member 150 may be implemented with a rigid PCB, and the part 160 connected with the PCB 120 that includes the PCM may be implemented with an FPCB. Accordingly, the part 160 may function as a bending area. The part 160 may be provided in a form that does not include a cover layer (e.g., a film layer) and a PPG layer.

In an embodiment of the disclosure, the heat dissipation member 150 may have a larger area than the PCB 120. For example, the area of the heat dissipation member 150 contacting the outside may be increased by making the area of the heat dissipation member 150 larger than the area of the PCB 120.

According to an embodiment of the disclosure, the part 160 connected with the PCB 120 may be formed of a flexible material. For example, the heat dissipation member 150 may be connected with the PCB 120 through the connecting part 160 of an FPCB form. The connecting part 160 of an FPCB form may function as a bending area.

Figure 2:
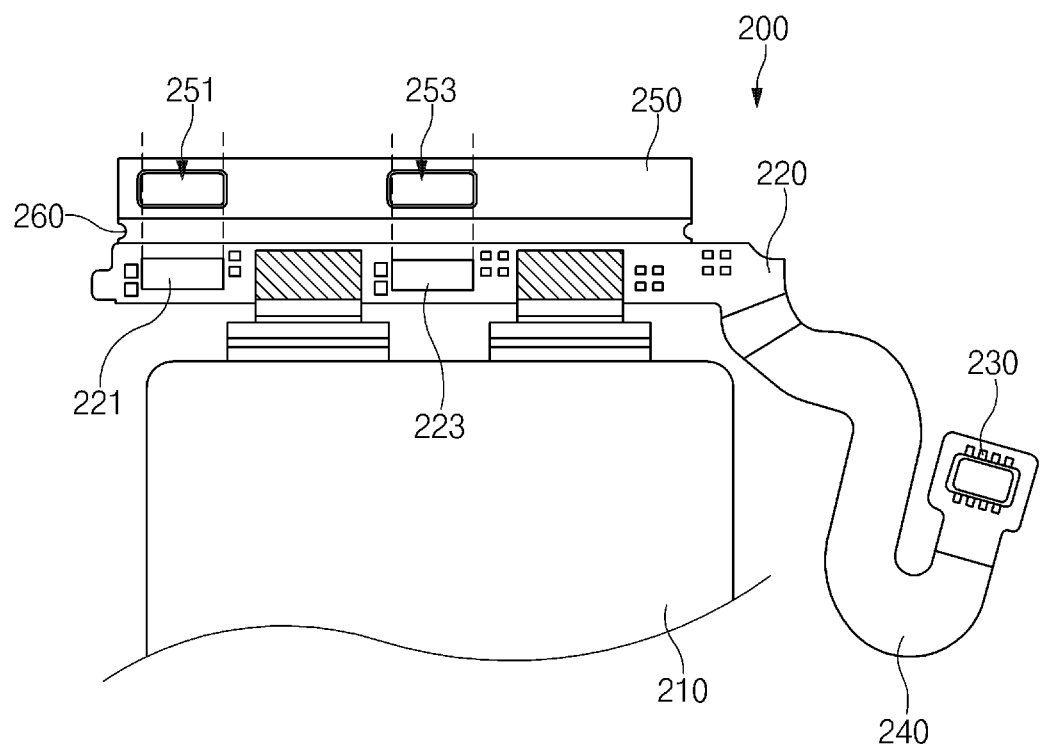
FIG. 2 illustrates a battery that includes an opening according to an embodiment of the disclosure.

FIG. 2 illustrates a battery that includes an opening according to an embodiment of the disclosure.

Referring to FIG. 2, a battery 200 may include the same configuration as, or a configuration similar to, that of the battery 100 of FIG. 1. For example, the battery 200 may include a pouch 210 (e.g., the pouch 110) that surrounds a battery cell, a PCB 220 (e.g., the PCB 120) that has a PCM formed thereon and includes a first switch 221 (e.g., the first switch 121) and a second switch 223 (e.g., the second switch 123), a connector 230 (e.g., the connector 130) connected with a main PCB of an electronic device, a connecting unit 240 (e.g., the connecting unit 140) that connects the connector 230 and the PCB 220, and a heat dissipation member 250 (e.g., the heat dissipation member 150) connected with the PCB 220 through a bending area 260 (e.g., the connecting part 160 of an FPCB form) and dissipating heat generated in the PCB 220 to the outside.

The battery 200 illustrated in FIG. 2 may have a structure that allows ventilation through openings (or air holes) (e.g., a first opening 251 and a second opening 253) formed in the heat dissipation member 250, as well as heat diffusion using the heat dissipation member 250. For example, in the case where the heat dissipation member 250 is bent (or folded) through the bending area 260 to face the PCB 220, the openings 251 and 253 may be aligned with the switches 221 and 223 that serve as a main heat source among components mounted on the PCB 220. Accordingly, heat generated from the switches 221 and 223 may be released to the outside through the openings 251 and 253, and external cool air may flow toward the switches 221 and 223 through the openings 251 and 253 to lower the temperature of the switches 221 and 223.

Although FIG. 2 illustrates that the heat dissipation member 250 has the first opening 251 aligned with the first switch 221 and the second opening 253 aligned with the second switch 223, the heat dissipation member 250 is not limited thereto. According to various embodiments of the disclosure, the heat dissipation member 250 may further include at least one other opening formed adjacent to the first or second opening 251 or 253, in addition the above-described openings 251 and 253. Furthermore, although FIG. 2 illustrates that the widths and heights of the first and second openings 251 and 253 are the same as, or similar to, the widths and heights of the first and second switches 221 and 223, respectively, the first and second openings 251 and 253, without being limited thereto, may have any width and height if communicating with the outside. However, the first and second openings 251 and 253 may have larger widths and heights than the first and second switches 221 and 223 to allow heat to be easily released to the outside or external air to be easily introduced into the inside.

Figure 3:
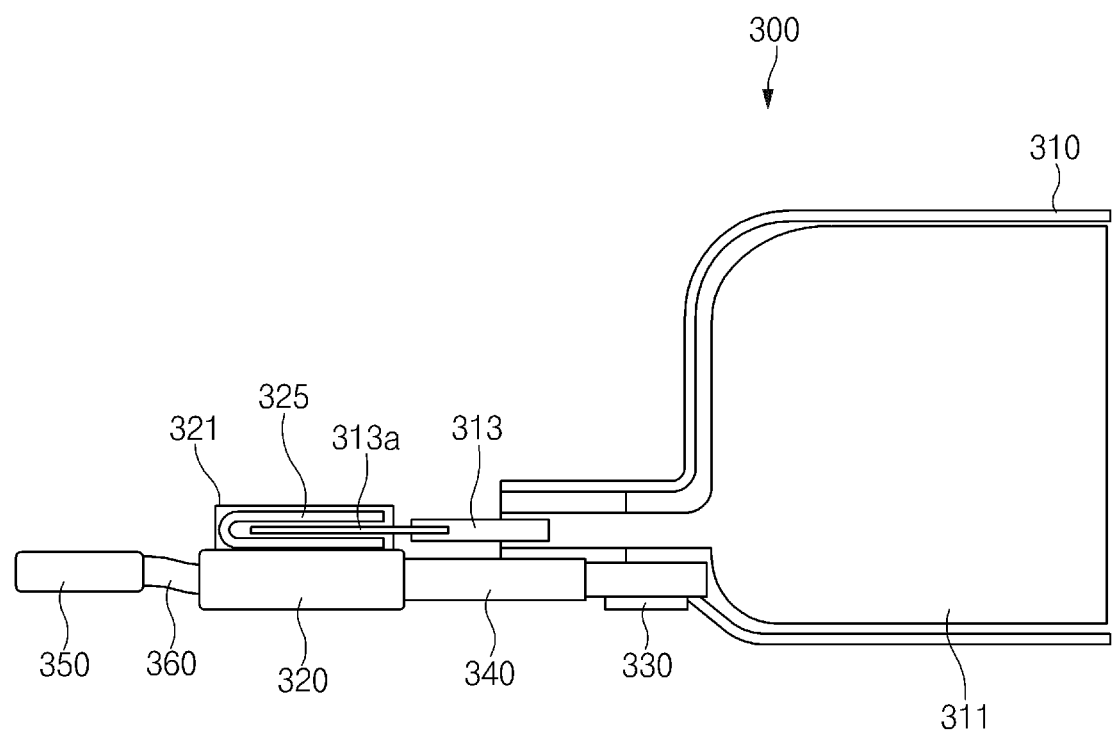
FIG. 3 illustrates a side view of a battery according to an embodiment of the disclosure.

FIG. 3 illustrates a side view of a battery according to an embodiment of the disclosure.

FIG. 3 illustrates a side view from the outside of the battery 100 of FIG. 1 or the battery 200 of FIG. 2. Hereinafter, descriptions of elements that are the same as, or similar to, those described with reference to FIGS. 1 and 2 will be omitted.

Referring to FIG. 3, a battery 300 may include a pouch 310 surrounding a battery cell 311, a tap 313 connected with the battery cell 311 and formed on one surface of the pouch 310, a tap plate 325 making contact with the tap 313 to transfer current supplied from the battery cell 311 to a printed circuit board (PCB) 320, the PCB 320 that includes the tap plate 325 and a switch 321, a connector 330 for electrically connecting the PCB 320 and a main PCB of an electronic device, a connecting unit 340 for connecting the connector 330 and the PCB 320, and a heat dissipation member 350 connected with the PCB 320 through a bending area 360 and dissipating heat generated in the PCB 320 to the outside.

The tap plate 325 may electrically connect the tap 313, which is connected to the battery cell 311, with the PCB 320. For example, the tap plate 325 may have the shape of a bent plate, and the bent plate may make contact with a part 313a of the tap 313 in such a manner that the bent plate surrounds the part 313a of the tap 313. In an embodiment of the disclosure, the part 313a may protrude from the tap 313 in the opposite direction to the battery cell 311 and may be inserted into the bent tap plate 325 to make contact with the tap plate 325. This structure exemplifies a structure for more stable contact between the tap 313 and the tap plate 325, and the contact structure between the tap 313 and the tap plate 325 is not limited thereto.

Figure 4:
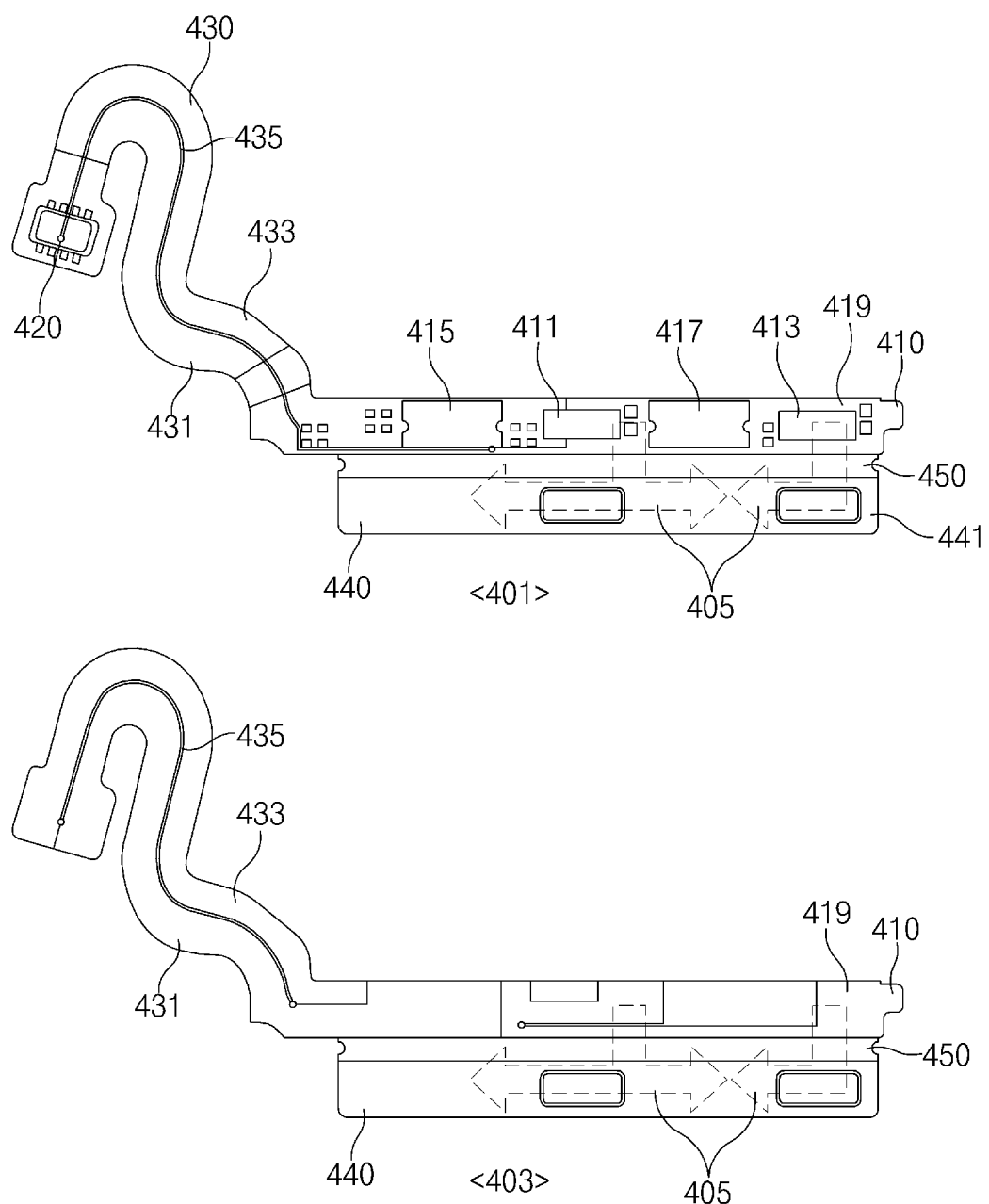
FIG. 4 illustrates a heat diffusion path according to an embodiment of the disclosure.

FIG. 4 illustrates a heat diffusion path according to an embodiment of the disclosure.

Referring to FIG. 4, heat generated in a PCB 410 (e.g., the PCB 220) may be transferred to a heat dissipation member 440 (e.g., the heat dissipation member 250) through a bending area 450 (e.g., the bending area 260). In this case, the heat dissipation member 440, together with the bending area 450, may be connected with a non-signal area 419 other than signal lines of the PCB 410, as a conductor for diffusing the heat generated in the PCB 410.

In this regard, the non-signal area 419 may include the remaining area of a copper (Cu) layer of the PCB 410 other than signal lines that connect power signal lines 431 and 433 and a sensing signal line 435 with components (e.g., a first switch 411, a second switch 413, a first tap plate 415, and a second tap plate 417) mounted on the PCB 410, in which the power signal lines 431 and 433 are disposed on a connecting unit 430 connected with a connector 420, and the sensing signal line 435 is configured to sense the status of a battery. Furthermore, the non-signal area 419 may also include part of the component areas.

The power signal lines 431 and 433 may be connected with a power line of a PMIC that is disposed on the PCB 410 to supply power, and the sensing signal line 435 may be connected with a fuel gauge to sense the status of the battery.

A view 401 on the upper side of FIG. 4 illustrates a top layer of the PCB 410, and a view 403 on the lower side of FIG. 4 illustrates a bottom layer of the PCB 410. As illustrated in FIG. 4, heat 405 generated in the first and second switches 411 and 413 disposed on the top layer may be transferred to an area 441 of the heat dissipation member 440 through the bending area 450 connected with the non-signal area 419 of the PCB 410, and the transferred heat 405 may diffuse across the heat dissipation member 440. The heat dissipation member 440 may be implemented with a copper (Cu) layer that is not connected with the signal lines.

According to an embodiment of the disclosure, the top layer and the bottom layer of the PCB 410 may be connected through vias, which results in an increase in the heat diffusion rate.

Figure 5:
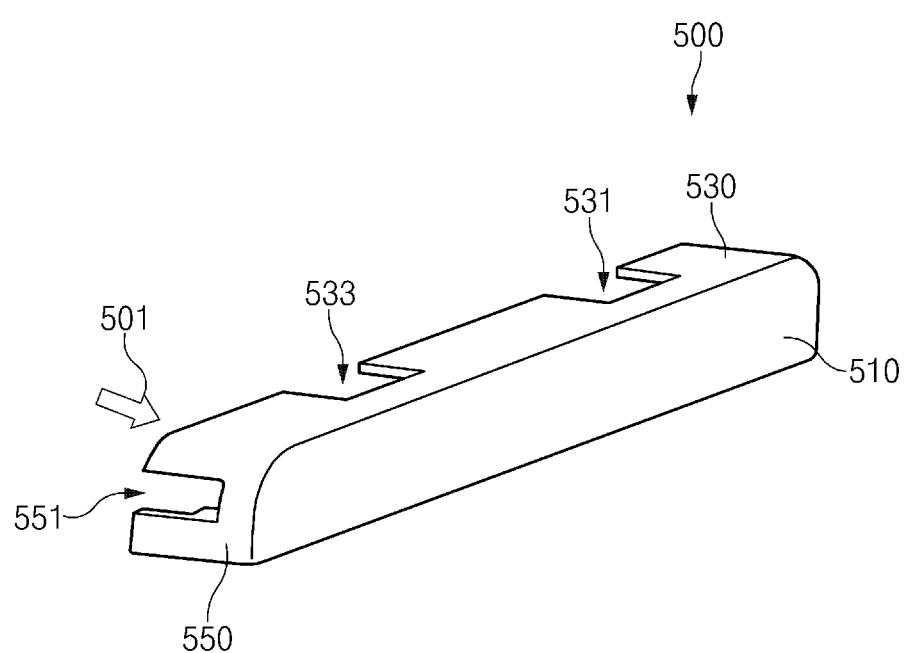
FIG. 5 illustrates a perspective view of a protective case according to an embodiment of the disclosure.

FIG. 5 illustrates a perspective view of a protective case according to an embodiment of the disclosure.

According to various embodiments of the disclosure, a battery (e.g., the battery 100 or 200) may include a protective case 500. The protective case 500 may protect, from external shocks, a part of the battery (e.g., the PCB 120 or 220) that is not enclosed by a battery pouch (e.g., the pouch 110 or 210), and may be used to reduce an area occupied by a protruding part (e.g., the part not being enclosed by the pouch). For example, the protective case 500 may be disposed to enclose a PCB having main circuits mounted thereon, among elements of the battery, and in the case where a bending area (e.g., the bending area 160 or 260) connected with the PCB is folded, the protective case 500 may support the bending area (e.g., the bending area 160 or 260) to stably maintain the shape of the bending area. Furthermore, the protective case 500 may protect a PCB including a PCM and may absorb a shock transferred between the PCB and the battery pouch in a battery pack state.

Referring to FIG. 5, the protective case 500 may provide a space into which the PCB (e.g., the PCB 120 or 220) of the battery that includes the PCM is inserted. For example, the protective case 500 may include a first surface 530 and a second surface 510 extending from one side of the first surface 530. The first surface 530 and the second surface 510 may be arranged substantially perpendicular to each other. For example, the protective case 500 may have an overall shape obtained by rotating "L" by 180 degrees in the counterclockwise direction. In this case, the PCB may be inserted in a direction 501 toward the second surface 510 such that the PCB is mounted in the space between the first surface 530 and the second surface 510. However, the shape of the protective case 500 is not limited thereto. The protective case 500 may further include at least one other surface, in addition to the first surface 530 and the second surface 510. FIG. 5 illustrates a state in which a third surface 550 connected with the first surface 530 and the second surface 510 is additionally disposed.

According to an embodiment of the disclosure, a heat dissipation member (e.g., the heat dissipation member 250) connected with the PCB may be located on the first surface 530 of the protective case 500. Furthermore, one or more openings (e.g., a first opening 531 and a second opening 533) may be formed in the first surface 530 of the protective case 500 and may be used as air passages, together with openings (e.g., the first opening 251 and the second opening 253) formed in the heat dissipation member.

According to an embodiment of the disclosure, the protective case 500 may have an opening 551 formed in the third surface 550 thereof, through which a connecting unit (e.g., the connecting unit 140 or 240) for connecting the PCB and a connector (e.g., the connector 130 or 230) communicates with the outside. For example, the connecting unit connected with the PCB may be exposed to the outside through the opening 551 formed in the third surface 550 of the protective case 500 in the state in which the PCB is inserted into the space between the first surface 530 and the second surface 510 of the protective case 500.

Figure 6:
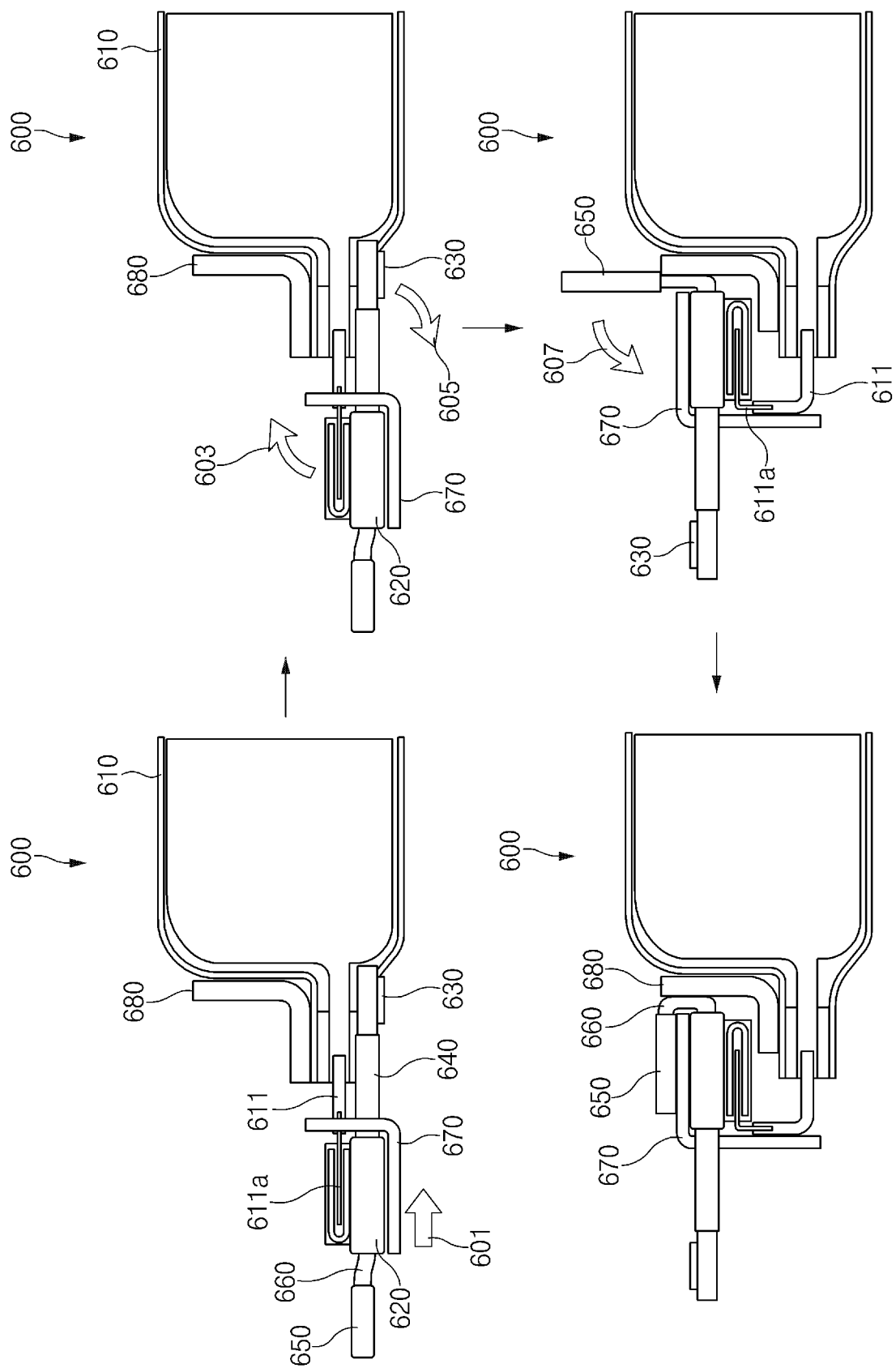
FIG. 6 illustrates a battery assembly process using a protective case according to an embodiment of the disclosure.

FIG. 6 illustrates a battery assembly process using a protective case according to an embodiment of the disclosure.

Referring to FIG. 6, a battery 600 (e.g., the battery 200) may protect, from external shocks, a part (e.g., a PCB 620) not being enclosed by a battery pouch 610, by using a protective case 670 (e.g., the protective case 500). For example, the PCB 620 may be inserted into the space in the protective case 670 and thus protected from external shocks.

Furthermore, the entire area occupied by the battery 600 may be reduced by folding a bending area 660 of a heat dissipation member 650 connected with the PCB 620. A battery assembly process to this end will be described in a serial order. First, the PCB 620 may be inserted in a first direction 601 (e.g., the direction toward the battery pouch 610) such that the PCB 620 is mounted in the space formed in the protective case 670. Thereafter, the protective case 670 may be lifted up in a second direction 603 (e.g., the direction toward the battery pouch 610). In this case, a tap 611 connected with the PCB 620 may be bent by about 180 degrees. In an embodiment of the disclosure, a protruding part 611a of the tap 611 may be bent by about 90 degrees, and thus the tap 611 may be bent by about 180 degrees as a whole.

If the protective case 670 is lifted up in the second direction 603, a connecting unit 640 connected with the PCB 620 and a connector 630 may move in a third direction 605 (e.g., the opposite direction to the second direction 603), and the heat dissipation member 650 may move toward the battery pouch 610 (e.g., in the second direction 603). In this case, since the heat dissipation member 650 cannot be located in a narrow space between the battery pouch 610 and the PCB 620, the bending area 660 of the heat dissipation member 650 may be bent in a fourth direction 607 (e.g., the opposite direction to the second direction 603) so that the heat dissipation member 650 may be moved onto and located on one surface of the protective case 670. As a result, the PCB 620 may be mounted on a lower side of the surface of the protective case 670, and the heat dissipation member 650 may be located on an upper side of the surface of the protective case 670.

According to an embodiment of the disclosure, in the case where the part not being enclosed by the battery pouch 610 is folded toward the battery pouch 610 by using the protective case 670, an adhesive member 680 may be disposed on the outside of the battery pouch 610 to allow a part facing the battery pouch 610 to be brought into close contact with the battery pouch 610. The adhesive member 680 may include, for example, a poron tape. As illustrated in FIG. 6, the adhesive member 680 may be attached to one surface of the battery pouch 610 that protrudes such that the tap 611 is formed and a side surface of the battery pouch 610 that is connected with the protruding surface.

Figure 7:
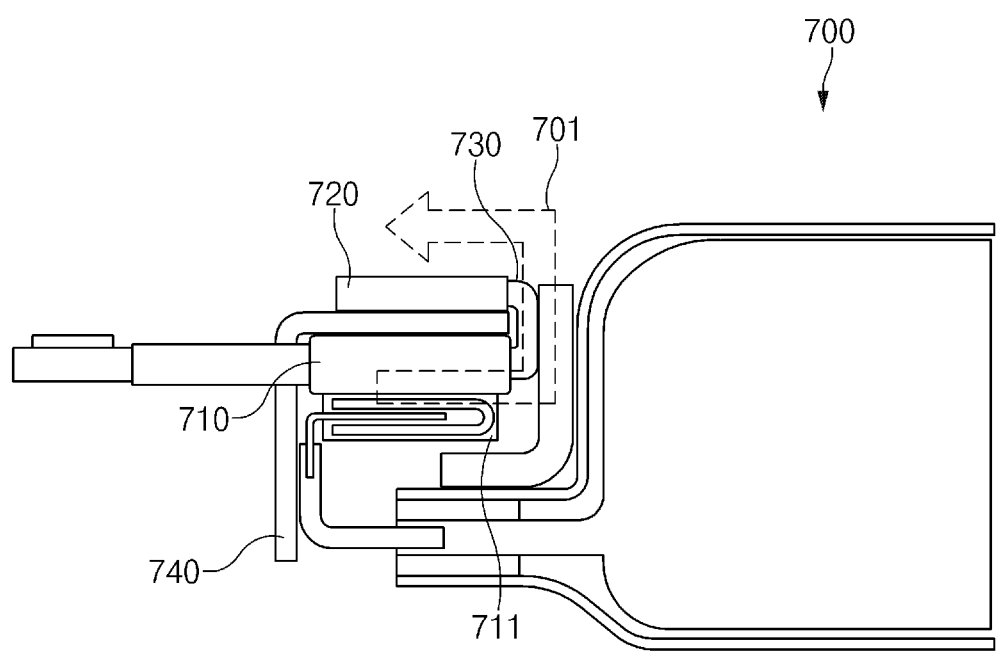
FIG. 7 illustrates a heat diffusion path according to an embodiment of the disclosure.

FIG. 7 illustrates a heat diffusion path according to an embodiment of the disclosure.

Referring to FIG. 7, a diffusion path of heat generated in a PCB 710 of a battery 700 (e.g., the battery 600) may be changed by folding a part not being enclosed by a battery pouch (e.g., the battery pouch 610) toward the battery pouch as in FIG. 6 by using a protective case 740 (e.g., the protective case 670). For example, heat generated in a switch 711 of the PCB 710 may be transferred to a heat dissipation member 720 through a bending area 730 connected with a non-signal area of the PCB 710, and the transferred heat may be released to the outside through the heat dissipation member 720 located on an outer surface of the protective case 740 and exposed to the outside (see reference number 701).

As a result, even though the protective case 740 is disposed to protect the PCB 710, the heat dissipation member 720 may be located on the outside of the protective case 740 by using a characteristic of the bending area 730 of the heat dissipation member 720, and thus it is possible to achieve a battery structure capable of ensuring a heat dissipation function while reducing the entire area occupied by the battery 700.

Figure 8:
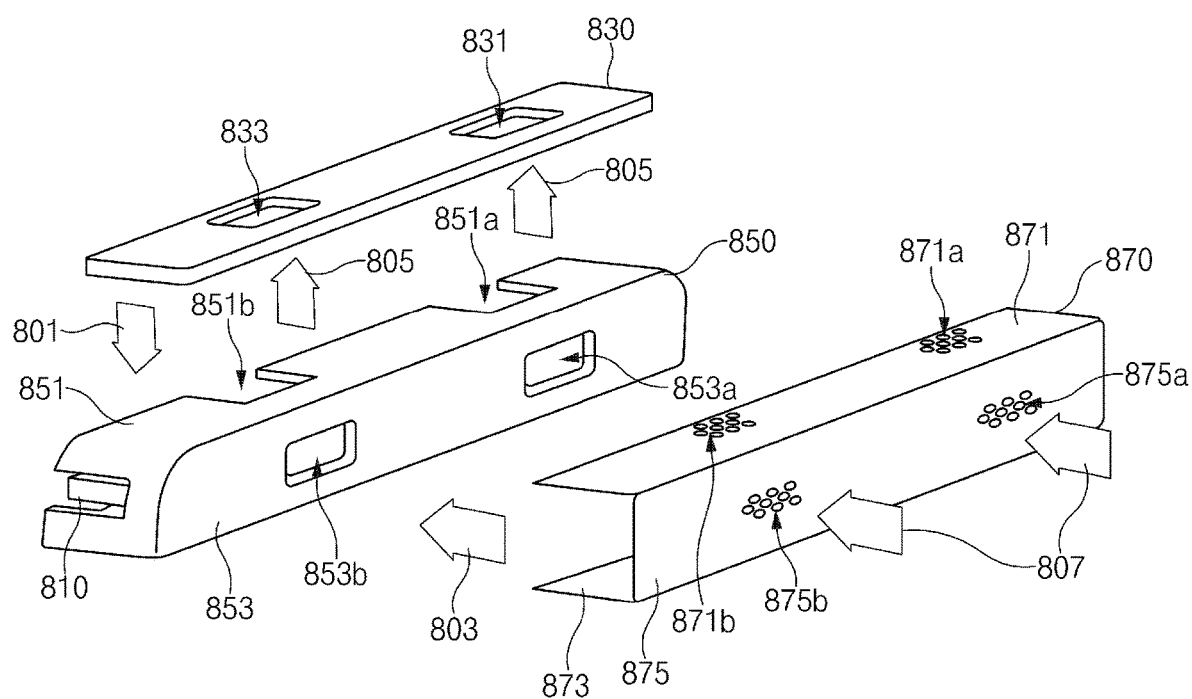
FIG. 8 illustrates a process of attaching a cover tape to a protective case according to an embodiment of the disclosure.

FIG. 8 illustrates a process of attaching a cover tape to a protective case according to an embodiment of the disclosure.

Referring to FIG. 8, according to various embodiments of the disclosure, a cover tape 870 may be additionally attached before a battery (e.g., the battery 700) is mounted in an electronic device. The cover tape 870 may be, for example, a cover sheet (or a finishing member) for the battery and may be used to increase a sense of unity with a battery pouch (e.g., the battery pouch 610). The cover tape 870 may include a first surface 871, a second surface 873 opposite to the first surface 871, and a third surface 875 surrounding part of a space between the first surface 871 and the second surface 873.

According to an embodiment of the disclosure, the cover tape 870 may be used as a means for improving heat conduction of a heat dissipation member 830 (e.g., the heat dissipation member 720). For example, the cover tape 870 may have a film form and may include an integrated heat-conductive member (e.g., a graphite sheet) on the inside thereof to perform a function of diffusing heat.

Referring to FIG. 8, the heat dissipation member 830 may be located on a side surface 851 of a protective case 850 (e.g., the protective case 740) in a first direction 801, and the cover tape 870 may be attached in a second direction 803 to cover the protective case 850. For example, the cover tape 870 may cover both the heat dissipation member 830 and the protective case 850.

According to an embodiment of the disclosure, the cover tape 870 may have punching holes (or openings) formed in at least one surface thereof that faces the protective case 850. For example, the cover tape 870 may have first punching holes 871a and second punching holes 871b formed in the first surface 871 thereof and third punching holes 875a and fourth punching holes 875b formed in the third surface 875 thereof.

The first punching holes 871a and the second punching holes 871b, together with first and second openings 831 and 833 formed in the heat dissipation member 830 and third and fourth openings 851a and 851b formed in the side surface 851 of the protective case 850, may be used as passages 805 for releasing heat generated in a component (e.g., a switch) mounted on a printed circuit board (PCB) 810. For example, the heat generated in the component of the PCB 810 may be released through the first heat dissipation passage 805 extending from the third opening 851a of the protective case 850 to the first punching holes 871a of the cover tape 870 via the first opening 831 of the heat dissipation member 830 and the second heat dissipation passage 805 extending from the fourth opening 851b of the protective case 850 to the second punching holes 871b of the cover tape 870 via the second opening 833 of the heat dissipation member 830. According to an embodiment of the disclosure, when viewed from above with the heat dissipation member 830 placed on the side surface 851 of the protective case 850, the side surface 851 of the protective case 850 may have the third opening 851a aligned with the first opening 831 formed in the heat dissipation member 830 and the fourth opening 851b aligned with the second opening 833.

According to an embodiment of the disclosure, the protective case 850 may have a fifth opening 853a and a sixth opening 853b formed in a second surface 853 thereof, and the third punching holes 875a and the fourth punching holes 875b formed in the third surface 875 of the cover tape 870, together with the fifth and sixth openings 853a and 853b formed in the second surface 853 of the protective case 850, may be used as air inflow passages 807 through which cool air flows toward the PCB 810. For example, external cool air may flow into the first air inflow passage 807 extending from the third punching holes 875a of the cover tape 870 to the fifth opening 853a of the protective case 850 and the second air inflow passage 807 extending from the fourth punching holes 875b of the cover tape 870 to the sixth opening 853b of the protective case 850.

Figure 9A:
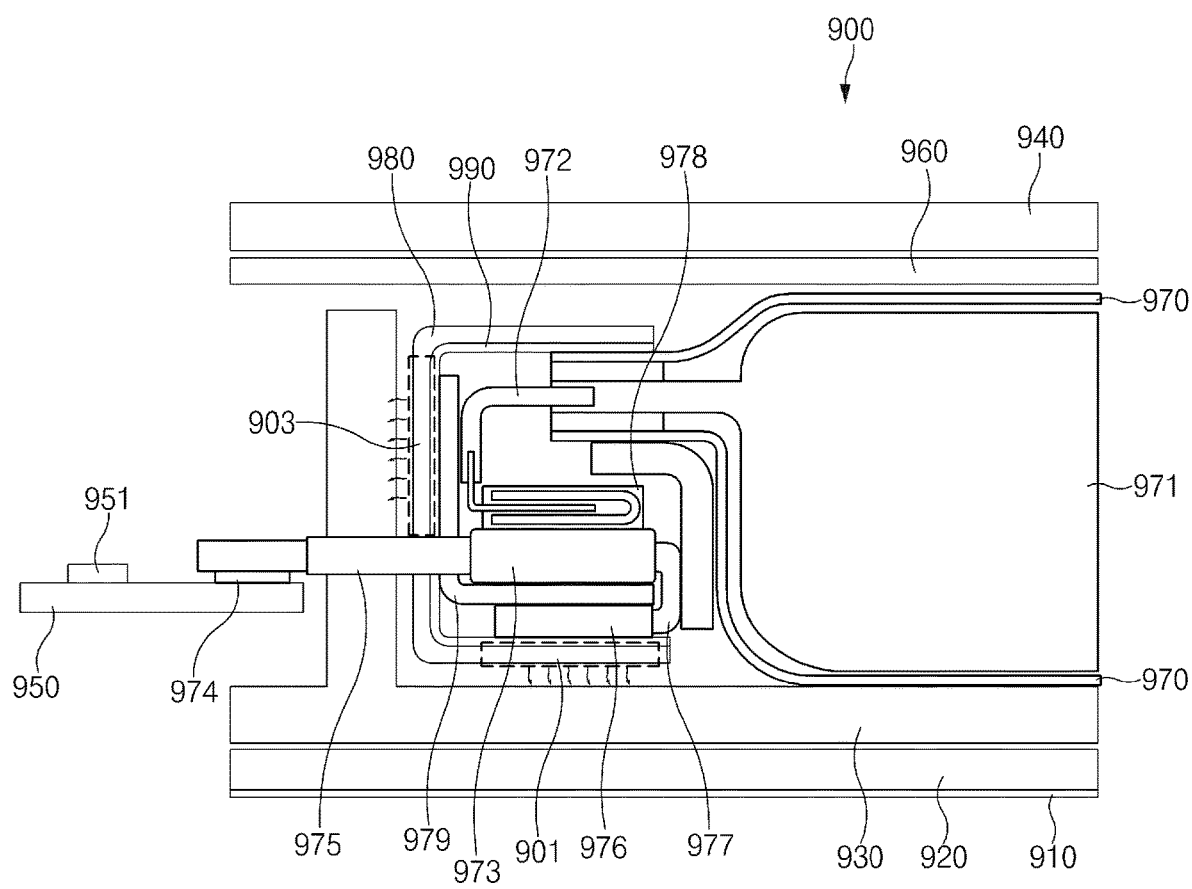
FIG. 9A illustrates heat dissipation through a cover tape according to an embodiment of the disclosure.
Figure 9B:
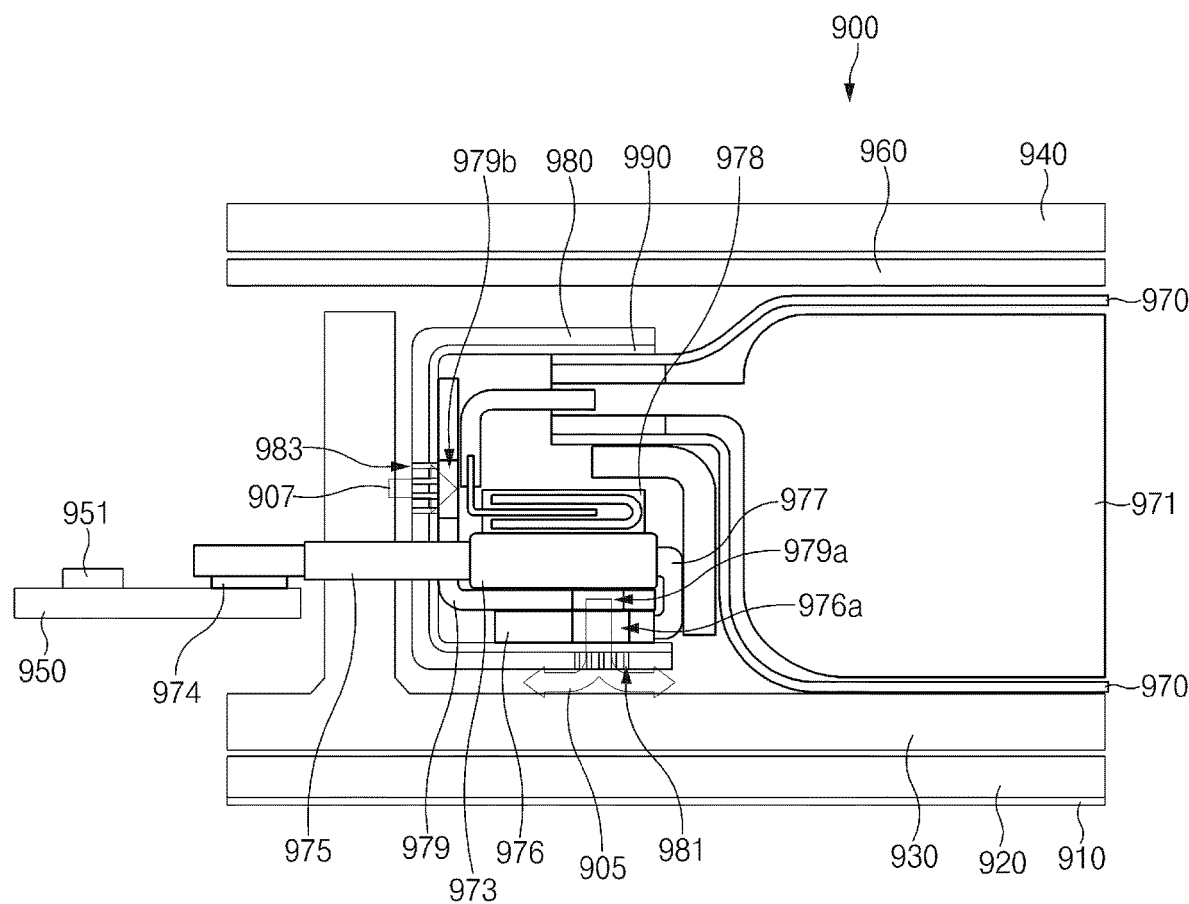
FIG. 9B illustrates a ventilation structure through an opening formed in a cover tape according to an embodiment of the disclosure.
Figure 9C:
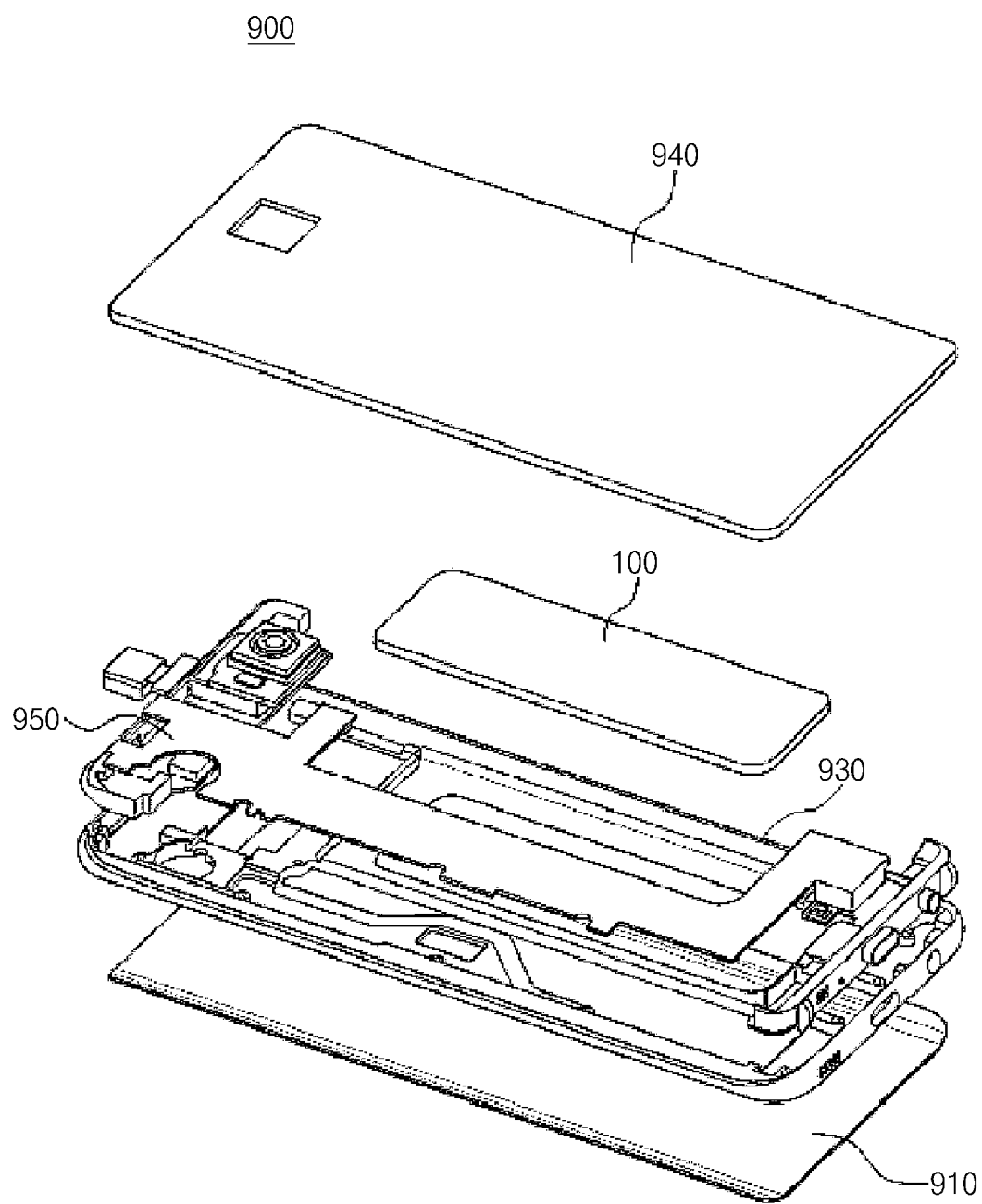
FIG. 9C illustrates an electronic device including a battery according to an embodiment of the disclosure.

FIG. 9A illustrates heat dissipation through a cover tape according to an embodiment of the disclosure. FIG. 9B illustrates a ventilation structure through an opening formed in a cover tape according to an embodiment of the disclosure. FIG. 9C illustrates an electronic device including a battery according to an embodiment of the disclosure.

Referring to FIGS. 9A, 9B, and 9C, an electronic device 900 may include a bracket 930 having a battery (e.g., the battery 200) and internal elements mounted thereon, a display 920 disposed on one surface of the bracket 930, a front cover 910 disposed on one surface of the display 920 to protect the display 920 from the outside, a wireless charging coil module 960 disposed on an opposite surface of the bracket 930 and having at least one communication circuit mounted thereon, and a rear cover 940 disposed on the outside of the wireless charging coil module 960 to cover the rear surface of the electronic device 900.

According to an embodiment of the disclosure, the battery may be mounted in an In-cell type on the bracket 930. The battery may include, for example, a pouch 970 surrounding a battery cell 971, at least one tap 972 connected with the battery cell 971 and protruding from one side of the pouch 970, a PCB 973 electrically connected with the tap 972, which is connected with the battery cell 971, through a tap plate, a connector 974 connected with a main PCB 950 of the electronic device 900 on which internal modules (e.g., a processor, a communication circuit, a memory, a PMIC 951, and the like) are mounted, a connecting unit 975 for connecting the connector 974 and the PCB 973, and a heat dissipation member 976 connected with the PCB 973 through a bending area 977 and dissipating heat generated in the PCB 973 to the outside.

According to an embodiment of the disclosure, the battery may include a cover tape 980 that serves as a cover sheet for the battery and includes an integrated heat-conductive member 990 (e.g., a graphite sheet) on the inside thereof. For example, the cover tape 980 may be attached to cover parts not being enclosed by the battery pouch 970, in which the cover tape 980 starts from an outer surface of a protruding part of the battery pouch 970 (e.g., the part to which the tap 972 is connected) and reaches an outer surface of the heat dissipation member 976 via an outer surface of a protective case 979 covering the PCB 973. In this case, the cover tape 980 having the integrated heat-conductive member 990 may be used not only to increase a sense of unity with the battery pouch 970 but also to improve heat conduction of the heat dissipation member 976. For example, as illustrated in FIG. 9A, heat generated from a switch 978 mounted on the PCB 973 may be transferred to the heat dissipation member 976 through the bending area 977 and may be diffused into the entire area of the cover tape 980 through the heat-conductive member 990 formed on the inside of the cover tape 980 covering the heat dissipation member 976. Accordingly, the heat may be released not only from a first area 901 of the cover tape 980 that is adjacent to the heat dissipation member 976, but also from a second area 903 of the cover tape 980.

According to an embodiment of the disclosure, the cover tape 980 having the integrated heat-conductive member 990 may have openings (or punching holes) formed in at least one surface thereof that faces the protective case 979. For example, the cover tape 980 may have first punching holes 981 (e.g., the first punching holes 871*a* and the second punching holes 871*b*) formed in one surface thereof that faces the heat dissipation member 976 and second punching holes 983 (e.g., the third punching holes 875*a* and the fourth punching holes 875*b*) formed in another surface thereof.

The first punching holes 981, together with a first opening 976*a* (e.g., the first opening 831 and the second opening 833) formed in the heat dissipation member 976 and a second opening 979*a* (e.g., the third opening 851*a* and the fourth opening 851*b*) formed in one surface of the protective case 979, may be used as a passage 905 for releasing heat generated in a component (e.g., the switch 978) mounted on the PCB 973. For example, the heat generated in the switch 978 of the PCB 973 may be released through the heat dissipation passage 905 extending from the second opening 979*a* of the protective case 979 to the first punching holes 981 of the cover tape 980 through the first opening 976*a* of the heat dissipation member 976.

The second punching holes 983, together with a third opening 979*b* (e.g., the fifth opening 853*a* and the sixth opening 853*b*) formed in another surface of the protective case 979, may be used as an air inflow passage 907 through which cool air flows toward the PCB 973. For example, external cool air may flow into the air inflow passage 907 extending from the second punching holes 983 of the cover tape 980 to the third opening 979*b* of the protective case 979.

According to an embodiment of the disclosure, the first opening 976*a* formed in the heat dissipation member 976 may have a size corresponding to that of the second opening 979*a* formed in the protective case 979. However, the size of the first opening 976*a* may be adjusted to ensure a contact area between the heat dissipation member 976 and the protective case 979. Furthermore, finishing may be performed on the punching holes (e.g., the first punching holes 981 and the second punching holes 983) formed in the cover tape 980, to make the openings (e.g., the first to third openings 976*a*, 979*a*, and 979*b*) inward of the punching holes not visible from the outside, thereby improving a sense of unity.

Figure 10:
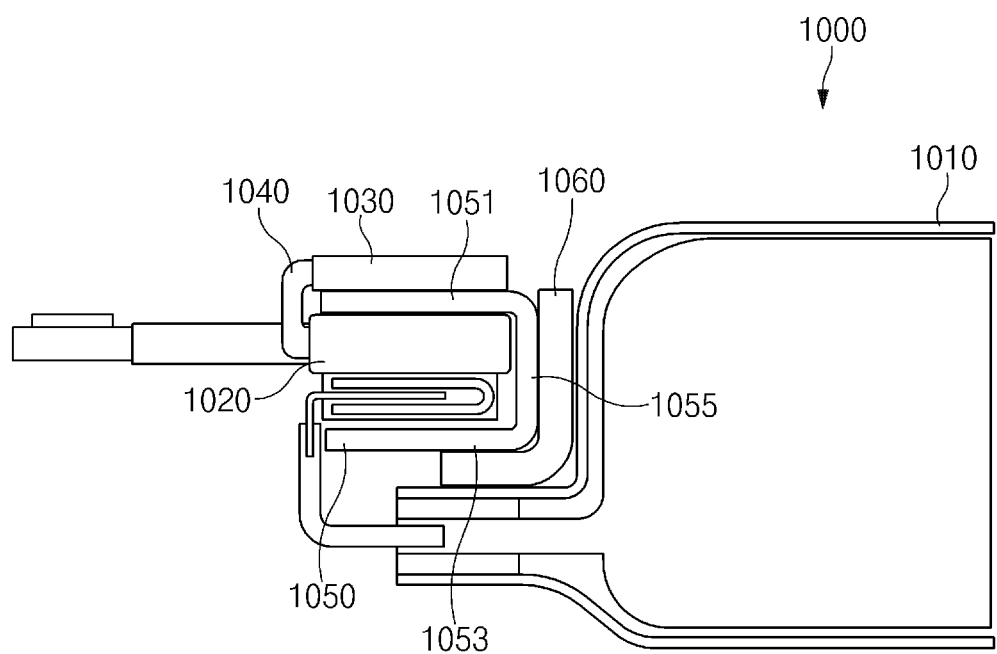
FIG. 10 illustrates a protective case according to an embodiment of the disclosure.

FIG. 10 illustrates a protective case according to an embodiment of the disclosure.

Referring to FIG. 10, a battery 1000 (e.g., the battery 700) may include a protective case 1050 having a different form from the protective cases 500, 670, and 740 described with reference to FIGS. 5 to 7. The protective case 1050 has to be open at one or more sides thereof to allow a printed circuit board (PCB) 1020 to be inserted into the protective case 1050. However, the protective cases 500, 670, and 740 in FIGS. 5 to 7 have a shape obtained by rotating "L" by a predetermined angle (e.g., 90, 180, or 270 degrees) in the counterclockwise direction, that is, the protective cases 500, 670, and 740 are open at two or more sides thereof, whereas the protective case 1050 in FIG. 10 may have a shape obtained by rotating "U" by a predetermined angle (e.g., 90, 180, or 270 degrees) in the counterclockwise direction, that is, the protective case 1050 may be open at one side thereof.

A heat dissipation member 1030 extending from the PCB 1020 may have a different shape and direction depending on the direction in which the protective case 1050 is open. For example, in FIG. 10, at least one surface (e.g., a side surface 1055 and a lower surface 1053) of the protective case 1050, which has a shape obtained by rotating "U" by 90 degrees in the counterclockwise direction, may be attached to an adhesive member 1060 (e.g., the adhesive member 680) stuck to one surface of a battery pouch 1010. In this case, a bending area 1040 of the heat dissipation member 1030 may be exposed through the unattached open side of the protective case 1050 and may be bent toward an upper surface 1051 of the protective case 1050. At this time, the heat dissipation member 1030 may be located on the upper surface 1051 of the protective case 1050 due to the bending of the bending area 1040. In an embodiment of the disclosure, before the battery 1000 is mounted in an electronic device, a cover tape may be additionally attached to the battery 1000. The cover tape may be used to increase a sense of unity with the battery pouch 1010 and to improve heat conduction of the heat dissipation member 1030.

Figure 11:
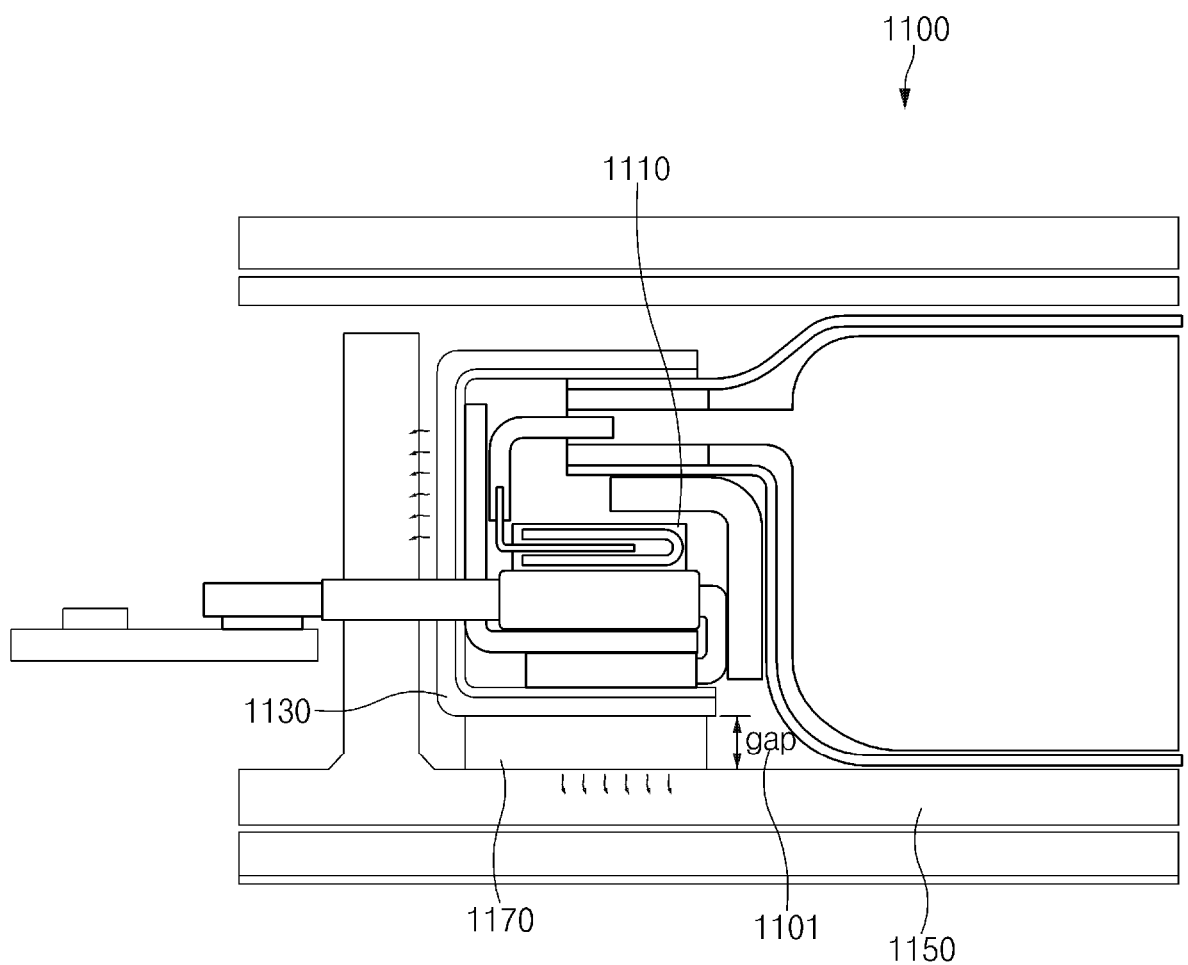
FIG. 11 illustrates heat transfer through a thermal interface material according to an embodiment of the disclosure.

FIG. 11 illustrates heat transfer through a thermal interface material according to an embodiment of the disclosure.

Referring to FIG. 11, an electronic device 1100 (e.g., the electronic device 900) may have a spatial gap 1101 between a PCM of a battery and a bracket 1150 since the PCM may have various forms. In the above-described embodiments of the disclosure, a PCM heat dissipation structure designed by an air cooling method using the spatial gap 1101 formed between the PCM and the bracket 1150 has been described. In FIG. 11, a method of using the bracket 1150 as a heat sink by filling the spatial gap 1101 between the PCM and the bracket 1150 with a thermal interface material (TIM) 1170 will be described.

Referring to FIG. 11, the electronic device 1100 may include the bracket 1150 (e.g., the bracket 930) therein, on which the battery (e.g., the battery 200) and internal elements are mounted. The battery may include a heat dissipation member extending from a PCB to diffuse heat generated in a component (e.g., a switch 1110) mounted on the PCB, and may include a top sheet 1130 to allow the heat transferred to the heat dissipation member to diffuse into a wider area.

According to an embodiment of the disclosure, the spatial gap 1101 may be formed between the top sheet 1130 and the bracket 1150. The electronic device 1100 may further include the thermal interface material 1170 disposed in the spatial gap 1101. For example, the thermal interface material 1170 may serve as a heat transfer path for connecting the top sheet 1130 and the bracket 1150. That is, heat generated from a component (e.g., the switch 1110) mounted on the PCB of the battery may be transferred to the top sheet 1130 via the heat dissipation member and may then be transferred to the bracket 1150 through the thermal interface material 1170.

As described above, according to various embodiments of the disclosure, a battery (e.g., the battery 100) may include a battery pouch (e.g., the pouch 110) including at least one conductive terminal exposed to the outside, a printed circuit board (e.g., the printed circuit board 120) electrically connected with the at least one conductive terminal and including a signal area and a non-signal area, a protection circuit electrically connected with the battery pouch, disposed on the signal area, and a heat dissipation plate (e.g., the heat dissipation member 150) connected with the non-signal area.

According to various embodiments of the disclosure, the battery may further include a case (e.g., the protective case 500, 850) having one surface that faces a side surface of the battery pouch and configured to receive the printed circuit board inside.

According to various embodiments of the disclosure, a first opening (e.g., the third opening 851a or the fourth opening 851b) may be formed in a surface of the case that faces the protection circuit, and at least a portion of the heat dissipation plate may be aligned to be located above the first opening.

According to various embodiments of the disclosure, a second opening (e.g., the first opening 831 or the second opening 833) may be formed in an area of the heat dissipation plate that corresponds to the first opening.

According to various embodiments of the disclosure, the battery may further include a finishing member (e.g., the cover tape 870) configured to at least partially surround the at least a portion of the heat dissipation plate and the case. And a third opening (e.g., the first punching holes 871a or the second punching holes 871b) may be formed in an area of the finishing member that faces the at least a portion of the heat dissipation plate.

According to various embodiments of the disclosure, the heat dissipation plate may be arranged so as not to face the battery pouch.

According to various embodiments of the disclosure, the at least one conductive terminal may include a first conductive terminal (e.g., the first tap 111) and a second conductive terminal (e.g., the second tap 113), and the printed circuit board may include a first tap plate (e.g., the first tap plate 125) connected with the first conductive terminal and a second tap plate (e.g., the second tap plate 127) connected with the second conductive terminal.

As described above, according to various embodiments of the disclosure, a battery may include a pouch configured to surround a battery cell and including at least one conductive terminal connected with the battery cell and exposed to the outside, a printed circuit board electrically connected with the at least one conductive terminal, with at least one component disposed on a signal area of the printed circuit board, and a heat dissipation member connected with a non-signal area of the printed circuit board.

According to various embodiments of the disclosure, the heat dissipation member may have at least one opening (e.g., the first opening 251 or the second opening 253) formed at a position aligned with the at least one component.

According to various embodiments of the disclosure, the heat dissipation member may extend from the printed circuit board and be formed by removing a cover layer of the printed circuit board.

According to various embodiments of the disclosure, the battery may further include a case configured to receive the printed circuit board inside. The heat dissipation member may be connected with the printed circuit board through a flexible member (e.g., the bending area 260), and the flexible member may be folded to allow the heat dissipation member to be located on the outside of the case.

According to various embodiments of the disclosure, the heat dissipation member may include a plurality of conductive layers, and at least one insulation layer located between the conductive layers to electrically isolate the conductive layers. And the flexible member may be integrally formed with the heat dissipation member and have a form in which the at least one insulation layer is removed.

According to various embodiments of the disclosure, the case may have at least one opening (e.g., the third opening 851a or the fourth opening 851b) formed in a surface of the case and aligned with the at least one component.

According to various embodiments of the disclosure, the battery may further include a cover sheet (e.g., the cover tape 870) attached to cover a portion of an outer surface of the pouch, an outer surface of the case, and an outer surface of the heat dissipation member. The cover sheet may have at least one opening (e.g., the first punching holes 871a or the second punching holes 871b) formed at a position aligned with the at least one component. And a heat-conductive member may be integrally formed with an inner surface of the cover sheet.

As described above, according to various embodiments of the disclosure, an electronic device (e.g., the electronic device 900) may include a bracket (e.g., the bracket 930), a main printed circuit board (e.g., the main printed circuit board 950) mounted on the bracket, with a processor disposed on the main printed circuit board, and a battery (e.g., the battery 100) mounted on the bracket. The battery may include a battery cell (e.g., the battery cell 971), a battery pouch (e.g., the pouch 970) configured to surround the battery cell, at least one conductive terminal (e.g., the tap 972) exposed outside the battery pouch, a printed circuit board (e.g., the printed circuit board 973) electrically connected with the at least one conductive terminal and including a signal area and a non-signal area, a protection circuit electrically connected with the battery pouch, disposed on the signal area, and a heat dissipation plate (e.g., the heat dissipation member 976) connected with the non-signal area.

According to various embodiments of the disclosure, the battery may further include a case (e.g., the protective case 979) having one surface that faces a side surface of the battery pouch and configured to receive the printed circuit board inside.

According to various embodiments of the disclosure, a first opening (e.g., the second opening 979a) may be formed in a surface of the case that faces the protection circuit, and at least a portion of the heat dissipation plate may be aligned to be located above the first opening.

According to various embodiments of the disclosure, a second opening (e.g., the first opening 976a) may be formed in an area of the heat dissipation plate that corresponds to the first opening.

According to various embodiments of the disclosure, the electronic device may further include a finishing member (e.g., the cover tape 980) configured to at least partially surround the at least a portion of the heat dissipation plate and the case. A third opening (e.g., the first punching holes 981) may be formed in an area of the finishing member that faces the at least a portion of the heat dissipation plate.

According to various embodiments of the disclosure, the heat dissipation plate may be arranged to face at least one surface of the bracket.

The term "module" used herein may represent, for example, a unit including one of hardware, software and firmware or a combination thereof. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific integrated circuit (ASIC) chip, a field-programmable gate array (FPGA), and a programmable-logic device for performing some operations, which are known or will be developed.

At least a part of devices (e.g., modules or functions thereof) or methods (e.g., operations) according to various embodiments of the disclosure may be implemented as instructions stored in a computer-readable storage medium in the form of a program module. In the case where the instructions are performed by a processor, the processor may perform functions corresponding to the instructions.

Certain aspects of the disclosure can also be embodied as computer readable code on a non-transitory computer readable recording medium. A non-transitory computer readable recording medium is any data storage device that can store data which can be thereafter read by a computer system. Examples of the non-transitory computer readable recording medium include a Read-Only Memory (ROM), a Random-Access Memory (RAM), Compact Disc-ROMs (CD-ROMs), magnetic tapes, floppy disks, and optical data storage devices. The non-transitory computer readable recording medium can also be distributed over network coupled computer systems so that the computer readable code is stored and executed in a distributed fashion. In addition, functional programs, code, and code segments for accomplishing the disclosure can be easily construed by programmers skilled in the art to which the disclosure pertains.

At this point it should be noted that the various embodiments of the disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various embodiments of the disclosure as described above. Alternatively, one or more processors operating in accordance with stored instructions may implement the functions associated with the various embodiments of the disclosure as described above. If such is the case, it is within the scope of the disclosure that such instructions may be stored on one or more non-transitory processor readable mediums. Examples of the processor readable mediums include a ROM, a RAM, CD-ROMs, magnetic tapes, floppy disks, and optical data storage devices. The processor readable mediums can also be distributed over network coupled computer systems so that the instructions are stored and executed in a distributed fashion. In addition, functional computer programs, instructions, and instruction segments for accomplishing the disclosure can be easily construed by programmers skilled in the art to which the disclosure pertains.

A module or a program module according to various embodiments of the disclosure may include at least one of the above-mentioned elements, or some elements may be omitted or other additional elements may be added. Operations performed by the module, the program module or other elements according to various embodiments of the disclosure may be performed in a sequential, parallel, iterative or heuristic way. Furthermore, some operations may be performed in another order or may be omitted, or other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A battery comprising:
a battery pouch including a battery cell therein;
a case connected to the battery pouch;
at least one conductive terminal extending from the battery cell to the inside of the case;
a printed circuit board disposed within the case and including a signal area;
a protection circuit electrically connected to the at least one conductive terminal, and disposed on at least a portion of the signal area; and
a heat dissipation plate extending from the protection circuit to the outside of the case,
wherein the heat dissipation plate extends outside of the case through between the case and the battery pouch, and
wherein the heat dissipation plate includes a curved surface.

2. The battery of claim 1, wherein the case includes a first surface that faces a side surface of the battery pouch.

3. The battery of claim 2,
wherein a first opening is formed in a second surface of the case that faces the protection circuit, and
wherein a portion of the heat dissipation plate is aligned to be located above the first opening.

4. The battery of claim 3, wherein a second opening is formed in an area of the heat dissipation plate that corresponds to the first opening.

5. The battery of claim 4, further comprising:
a finishing member configured to at least partially surround the portion of the heat dissipation plate and the case,
wherein a third opening is formed in an area of the finishing member that faces the portion of the heat dissipation plate.

6. The battery of claim 1, wherein the heat dissipation plate is arranged so as not to face the battery pouch.

7. The battery of claim 1,
wherein the at least one conductive terminal includes a first conductive terminal and a second conductive terminal, and
wherein the printed circuit board includes a first tap plate connected with the first conductive terminal and a second tap plate connected with the second conductive terminal.

8. A battery comprising:
a pouch configured to surround a battery cell and including at least one conductive terminal connected with the battery cell and exposed to the outside;
a printed circuit board electrically connected with the at least one conductive terminal, with at least one component disposed on a signal area of the printed circuit board;
a case configured to receive the printed circuit board inside;
a heat dissipation member located outside the case; and
a flexible member extending from a non-signal area of the printed circuit board to the heat dissipation member,
wherein at least a portion of the flexible member extends through a space between the pouch and the case.

9. The battery of claim 8, wherein the heat dissipation member extends from the printed circuit board and is formed by removing a cover layer of the printed circuit board.

10. The battery of claim 8,
wherein the heat dissipation member includes:
a plurality of conductive layers; and
at least one insulation layer located between the plurality of conductive layers to electrically isolate the plurality of conductive layers, and
wherein the flexible member is integrally formed with the heat dissipation member and has a form in which the at least one insulation layer is removed.

11. The battery of claim 8, further comprising:
a cover sheet attached to cover a portion of an outer surface of the pouch, an outer surface of the case, and an outer surface of the heat dissipation member,
wherein the cover sheet has at least one opening formed at a position aligned with the at least one component, and
wherein a heat-conductive member is integrally formed with an inner surface of the cover sheet.

12. An electronic device comprising:
a bracket;
a main printed circuit board mounted on the bracket, with a processor disposed on the main printed circuit board; and
a battery mounted on the bracket,
wherein the battery includes:
a battery cell;
a battery pouch configured to surround the battery cell;
a conductive terminal extended from the battery cell and exposed outside the battery pouch;
a case connected to the battery pouch and having a portion of the conductive terminal;
a printed circuit board disposed within the case and including a signal area and a non-signal area,
a protection circuit electrically connected with the conductive terminal and disposed on the signal area; and
a heat dissipation plate connected with the non-signal area and extended from the non-signal area to the outside of the case,
wherein the case having a first surface that faces a side surface of the battery pouch,
wherein a first opening is formed in a second surface of the case that faces the protection circuit, and
wherein a portion of the heat dissipation plate is aligned to be located above the first opening.

13. The electronic device of claim 12, wherein a second opening is formed in an area of the heat dissipation plate that corresponds to the first opening.

14. The electronic device of claim 13, further comprising:
a finishing member configured to at least partially surround the portion of the heat dissipation plate and the case,
wherein a third opening is formed in an area of the finishing member that faces the portion of the heat dissipation plate.

15. The electronic device of claim 12, wherein the heat dissipation plate is arranged to face at least one surface of the bracket.

* * * * *